US011733313B2

(12) United States Patent
Simonis et al.

(10) Patent No.: US 11,733,313 B2
(45) Date of Patent: Aug. 22, 2023

(54) METHOD AND APPARATUS FOR OPERATING A SYSTEM FOR PROVIDING STATES OF HEALTH OF ELECTRICAL ENERGY STORES FOR A MULTIPLICITY OF DEVICES WITH THE AID OF MACHINE LEARNING METHODS

(71) Applicant: Robert Bosch GmbH, Stuttgart (DE)

(72) Inventors: Christian Simonis, Leonberg (DE);
Christoph Woll, Gerlingen, DE (US)

(73) Assignee: Robert Bosch GmbH, Stuttgart (DE)

(*) Notice: Subject to any disclaimer, the term of this patent is extended or adjusted under 35 U.S.C. 154(b) by 126 days.

(21) Appl. No.: 17/487,800

(22) Filed: Sep. 28, 2021

(65) Prior Publication Data

US 2022/0099751 A1 Mar. 31, 2022

(30) Foreign Application Priority Data

Sep. 29, 2020 (DE) .................. 10 2020 212 236.9

(51) Int. Cl.
*G01R 31/392* (2019.01)
*G01R 31/367* (2019.01)
*G06N 3/088* (2023.01)
*G01R 31/396* (2019.01)
*G06N 20/00* (2019.01)
(Continued)

(52) U.S. Cl.
CPC ......... *G01R 31/392* (2019.01); *G01R 31/367* (2019.01); *G01R 31/396* (2019.01); *G06F 18/23213* (2023.01); *G06N 3/047* (2023.01); *G06N 3/088* (2013.01); *G06N 20/00* (2019.01)

(58) Field of Classification Search
CPC .. G01R 31/392; G01R 31/396; G01R 31/367; G06N 20/00; G06N 3/047; G06N 3/088; G06F 18/23213
See application file for complete search history.

(56) References Cited

U.S. PATENT DOCUMENTS

| 2013/0085696 A1 | 4/2013 | Xu et al. |
| 2013/0185007 A1* | 7/2013 | Imre ............... G01R 31/392 |
| | | 702/63 |
| 2016/0349330 A1 | 12/2016 | Barfield, Jr. et al. |

(Continued)

FOREIGN PATENT DOCUMENTS

EP 2 913 687 A1 9/2015

*Primary Examiner* — Raymond L Nimox
(74) *Attorney, Agent, or Firm* — Maginot, Moore & Beck LLP

(57) ABSTRACT

A method for operating a central processing unit which is communicatively connected to a plurality of devices having electrical energy stores, includes determining a data-based state of health model which is trained to assign a state of health to an operating feature point which characterizes operation of a corresponding electrical energy store of the electrical energy stores of the plurality of devices and results from a plurality of operating features, determining operating feature points for the electrical energy stores of the plurality of devices, and selecting at least one of the operating feature points based on state uncertainties of the states of health of all operating feature points of the corresponding electrical energy store, such that the at least one operating feature point has a highest relevance for improving the state uncertainties of the operating feature points determined.

12 Claims, 5 Drawing Sheets

(51) Int. Cl.
*G06F 18/23213* (2023.01)
*G06N 3/047* (2023.01)

(56) References Cited

U.S. PATENT DOCUMENTS

| | | | | |
|---|---|---|---|---|
| 2017/0003352 | A1* | 1/2017 | Barre | G01R 31/007 |
| 2017/0120766 | A1* | 5/2017 | Huber | B60L 58/12 |
| 2019/0363551 | A1* | 11/2019 | Patey | G01R 31/392 |
| 2020/0164763 | A1* | 5/2020 | Holme | B60L 58/10 |
| 2021/0336471 | A1* | 10/2021 | Leatherdale | H02J 7/0047 |
| 2022/0067850 | A1* | 3/2022 | Bhasme | H02J 7/00716 |
| 2022/0163594 | A1* | 5/2022 | Kuovo | H02J 7/005 |
| 2022/0314835 | A1* | 10/2022 | Altaf | B60L 58/13 |

* cited by examiner

METHOD AND APPARATUS FOR OPERATING A SYSTEM FOR PROVIDING STATES OF HEALTH OF ELECTRICAL ENERGY STORES FOR A MULTIPLICITY OF DEVICES WITH THE AID OF MACHINE LEARNING METHODS

This application claims priority under 35 U.S.C. § 119 to patent application no. DE 10 2020 212 236.9, filed on Sep. 29, 2020 in Germany, the disclosure of which is incorporated herein by reference in its entirety.

FIELD

The disclosure relates to electrical devices which are operated independently of the mains and have electrical energy stores, in particular electrically driveable motor vehicles, in particular electric vehicles or hybrid vehicles, and also to measures for determining a state of health (SOH) of the electrical energy stores. In addition to mobile electrical energy stores, the disclosure furthermore also relates to stationery electrical energy stores.

BACKGROUND

Electrical devices and machines which are operated independently of the mains, for example electrically driveable motor vehicles, are supplied with energy with the aid of electrical energy stores, generally device batteries or vehicle batteries. These provide electrical energy for operating the devices. However, fuel cells also come into consideration as an electrical energy store.

The state of health of an energy store noticeably decreases over the course of its service life, the effect of which is a decreasing maximum storage capacity. The extent of the ageing of the energy store depends on an individual load on the energy store, that is to say, in the case of vehicle batteries of motor vehicles, on the usage behavior of a driver, external environmental conditions and the type of vehicle battery.

Although a physical state of health model can be used to determine the present state of health of the energy store on the basis of historical operating state characteristics, this model is inaccurate in certain situations. This inaccuracy of the conventional state of health model makes it difficult to predict the state of health characteristic. However, the prediction of the characteristic of the state of health of the energy stores is an important technical variable since it makes it possible to financially assess a residual value of the energy store.

SUMMARY

The disclosure provides a method for operating a central processing unit for providing a state of health model for electrical energy stores, in particular of electrically operated devices or machines, as well as a method for operating an electrically operable device, an apparatus in an electrically operable device and a central processing unit.

A first aspect provides a computer-implemented method for operating a central processing unit which is communicatively connected to a multiplicity of devices having electrical energy stores, comprising the following steps of:
providing a data-based state of health model which is trained to assign a state of health to an operating feature point which characterizes operation of the electrical energy store and results from a plurality of operating features,
providing operating feature points for the energy stores of the multiplicity of devices;
selecting at least one of the operating feature points on the basis of state uncertainties of the states of health of all operating feature points of the energy store, with the result that the at least one operating feature point has the highest relevance for improving state uncertainties of the operating feature points provided;
selecting at least one device from the multiplicity of devices on the basis of the at least one selected operating feature point;
prompting a measurement of the present actual state of health in the at least one selected device;
retraining the data-based state of health model on the basis of the result of the measurement of the actual state of health.

Furthermore, the operating features can be determined for an evaluation period from characteristics of operating variables of the energy stores, preferably since the start-up of all devices.

The state of health of a rechargeable electrical energy store, in particular a device battery, is usually not measured directly. This would require a series of sensors in the vicinity of the energy store, which would make the production of such an energy store cost-intensive and complicated and would increase the space required. In addition, everyday measurement methods for determining the state of health in the devices are not yet available on the market. Therefore, the present state of health is generally determined with the aid of a physical ageing model in the devices. This physical state of health model is inaccurate in certain situations and usually has model discrepancies of up to more than 5%.

On account of the inaccuracy of the physical ageing model, it can also only indicate the present state of health of the energy store. A prediction of the state of health, which depends, in particular, on the method of operation of the energy store, for example on the level and amount of charge flowing into and out of a device battery, and therefore on a usage behavior and usage parameters, would result in very inaccurate predictions and is currently not provided.

In the case of device batteries as an electrical energy store, the state of health (SOH) is the key variable for indicating a remaining battery capacity or a remaining battery charge. The state of health describes an extent of the ageing of the electrical energy store. In the case of a device battery or a battery module or a battery cell, the state of health can be stated as a capacity retention rate (SOH-C) or as a rise in the internal resistance (SOH-R). The capacity retention rate SOH-C is stated as a ratio of the measured present capacity to an initial capacity of the fully charged battery. The relative change in the internal resistance SOH-R increases with increasing ageing of the battery.

Approaches to providing a user-specific and use-specific prediction of a state of health of the electrical energy store on the basis of a data-based state of health model are promising. The data-based state of health model, which may also be in the form of a hybrid model, that is to say a combination of physical and data-based models, can be implemented in a central processing unit (cloud) and can be trained with the aid of operating variables of a multiplicity of devices which are communicatively connected to the central processing unit.

State of health models for determining states of health for electrical energy stores may be purely data-based or in the form of a hybrid state of health model having a combination of a physical ageing model with a data-based correction model. Furthermore, the data-based state of health model may be designed with a probabilistic regression model or a regression model based on artificial intelligence, in particular a Gaussian process model. Possible alternatives to supervised learning are a random forest model, an AdaBoost model, a support vector machine or a Bayesian neural network.

In the case of a hybrid model, a state of health can be determined with the aid of a physical or physically motivated ageing model and a correction value, which results from a data-based correction model, can be applied to said state of health, in particular by addition or multiplication.

Data-based models generally require a training process, for which training data sets are required.

The generation of a training data set for a device battery in a particular device is associated with certain restrictions for its user since a diagnostic measurement (real measurement), for example in the form of a complete charging cycle, is required, preferably carried out under reproducible environmental conditions with a low current intensity. This requires a longer charging period in which the device should not be operated. A meaningful statement on the state of health can be obtained, for example, if the device battery is changed from a fully discharged state to a fully charged state during a charging operation. This method of determining the state of health is based on a basic model of the device battery and a determination of a maximum charge of the device battery by means of Coulomb counting. It is likewise possible to measure lower charge strokes of a device battery in order to determine the state of health, but only with a lower degree of accuracy.

Overall, it is therefore possible, without external intervention in the device battery, to provide training data sets which allow a statement on the state of health of the device battery. However, the training data sets are either determined only at particular suitable times according to the user behavior or the user of a device must be specifically requested to accept a longer charging time if a training data set is intended to be systematically determined.

In particular during an initial period in fleet operation, the estimation of the model value of the data-based state of health model has regions of operating states of high uncertainty over the modeled state of health. The reason for this is an inadequate training basis for all relevant operating ranges of the device battery since all operating points of the considered device batteries are not yet known. These operating states of the device battery are determined by means of characteristics of battery states which can each be characterized by operating features. The operating features characterize use of the device battery in one or more evaluation periods and can be generated from the characteristics of the operating variables, for example the characteristics of the battery current, the battery voltage, the battery temperature and the state of charge, within the evaluation period.

The operating features determine the input variable point (operating feature point) for which the data-based state of health model is trained. In order to specifically improve the data-based state of health model, it is expedient to generate labels for precisely those operating feature points at which there is a high state uncertainty and, at the same time, a high relevance for further energy stores of the fleet. For this purpose, the data-based state of health model is selected in such a manner that, in addition to a model value prediction, it can also determine an indication of a state uncertainty. Probabilistic regression models or regression models based on artificial intelligence, for example a Gaussian process model or alternative supervised learning methods, are suitable as models, for example.

That operating feature point for which label generation achieves the greatest possible reduction in the state uncertainties at all real and relevant operating feature points is intended to be selected by evaluating previously captured, real operating feature points for the multiplicity of devices which are connected to the central processing unit using the data-based state of health model. The selected operating feature point therefore has the greatest relevance for developing the data-based state of health model, with the result that the state uncertainties of the states of health are reduced at all real operating feature points.

For this purpose, at least one of the operating feature points can be selected by determining a predefined number (for example between 50 and 500) of operating feature points with the highest state uncertainties of the state of health and assessing, from the predefined number of operating feature points, the relevance for further energy stores of the fleet with the aid of a clustering method. This is preferably carried out by selecting that operating feature point which is closest to the centroid of the cluster area found.

In particular, the clustering method can be carried out using one of the following methods: K-means, EM clustering, Gaussian mixture models and competitive learning.

The selected operating feature point can be checked for physical safety limits and limitations of the operation of the energy store with the aid of at least one predefined criterion, wherein the selection of at least one device from the multiplicity of devices on the basis of the at least one selected operating feature point for measuring the present actual state of health depends on the result of the check.

Furthermore, the selection of the at least one device from the multiplicity of devices with states of the energy store which corresponds in the best possible way to the operating feature point can be carried out with the aid of an active learning method, in particular using one of the following methods: pool-based sampling, uncertainty sampling, variance reduction and expected error reduction.

Therefore, labels are generated at the weak points of the data-based model, wherein the uncertainty can preferably be assessed using a Gaussian process with regard to the state uncertainty thereof or confidence of the model output, that is to say the state of health. It is then assessed, by means of cluster analysis, which of the state uncertainties are representative of the multiplicity of devices. This operating feature space is used to request the generation of a label by one of the devices. The relevant device can be selected with the aid of active learning methods on the basis of the selected operating feature point, with the aim of then generating a relevant label at this energy store by means of a diagnostic measurement (real measurement).

A request to generate a label, in particular a request to carry out a measurement at a planned time, is transmitted to this device on the basis of the clustered model analysis of all operating feature points in succession.

For example, in the case of a device battery, a complete discharge and a subsequent complete charging operation can be carried out there in order to determine the present state of health of the device battery by means of Coulomb counting. This is preferably carried out with a low current intensity in order to minimize dynamic influences of the battery which can influence the measurement accuracy.

The labels generated in this manner are now used in the central processing unit, for example, to retrain or improve the data-based state of health model. This makes it possible to gradually improve the data-based state of health model with the smallest possible number of label generation operations, that is to say measurement operations.

These measurement operations are usually an impairment for the users of the devices. The specific selection of devices for label generation makes it possible, on the one hand, to efficiently improve the data-based state of health model by considerably reducing the state uncertainties at the operating feature points and, on the other hand, the user acceptance is improved on account of the high fleet representation of the label by virtue of the smaller number of label generation operations, since the users of the devices are less frequently requested to carry out label generation measures for improving the state of health model.

In addition, the data-based state of health model is automatically improved with this automatic process without the need for manual intervention.

In addition, provision may be made for the model parameters of the retrained state of health model to be transmitted to the devices, wherein the state of health is determined in the devices. Furthermore, it is possible for the results of the state of health model to be transmitted to the devices.

According to further embodiments, the multiplicity of devices may comprise a motor vehicle, a pedelec, an aircraft, in particular a drone, a machine tool, a household appliance, a consumer electronics device (mobile telephone, wireless headset, etc.), an autonomous robot, an energy supply system and the like.

A further aspect provides an apparatus for operating a central processing unit which is communicatively connected to a multiplicity of devices having electrical energy stores, wherein the apparatus is designed to:
- provide a data-based state of health model which is trained to assign a state of health to an operating feature point which characterizes operation of the electrical energy store and results from a plurality of operating features of the energy store,
- provide operating feature points for the energy stores of the multiplicity of devices;
- select at least one of the operating feature points on the basis of the state uncertainties of the states of health of all operating feature points of the energy store, with the result that the at least one operating feature point has the highest relevance for improving state uncertainties of the operating feature points provided;
- select at least one device from the multiplicity of devices on the basis of the at least one selected operating feature point;
- prompt a measurement of the present actual state of health in the at least one selected device;
- retrain the data-based state of health model on the basis of the result of the measurement of the actual state of health.

BRIEF DESCRIPTION OF THE DRAWINGS

Embodiments are explained in more detail below on the basis of the accompanying drawings, in which.

DETAILED DESCRIPTION

The method according to the disclosure is described below on the basis of vehicle batteries as an electrical energy store in a multiplicity of motor vehicles as similar devices. In the motor vehicles, a data-based state of health model for the respective vehicle battery can be implemented in a control unit. The state of health model can be continuously updated or retrained in a central processing unit on the basis of operating variables of the vehicle batteries from the vehicle fleet.

The above example is representative of a multiplicity of stationary or mobile devices having a mains-independent energy supply, for example vehicles (electric vehicles, pedelecs, etc.), installations, machine tools, household appliances, IoT devices and the like, which are connected to a central processing unit (cloud) via a corresponding communication connection (for example LAN, Internet).

Figure 1:
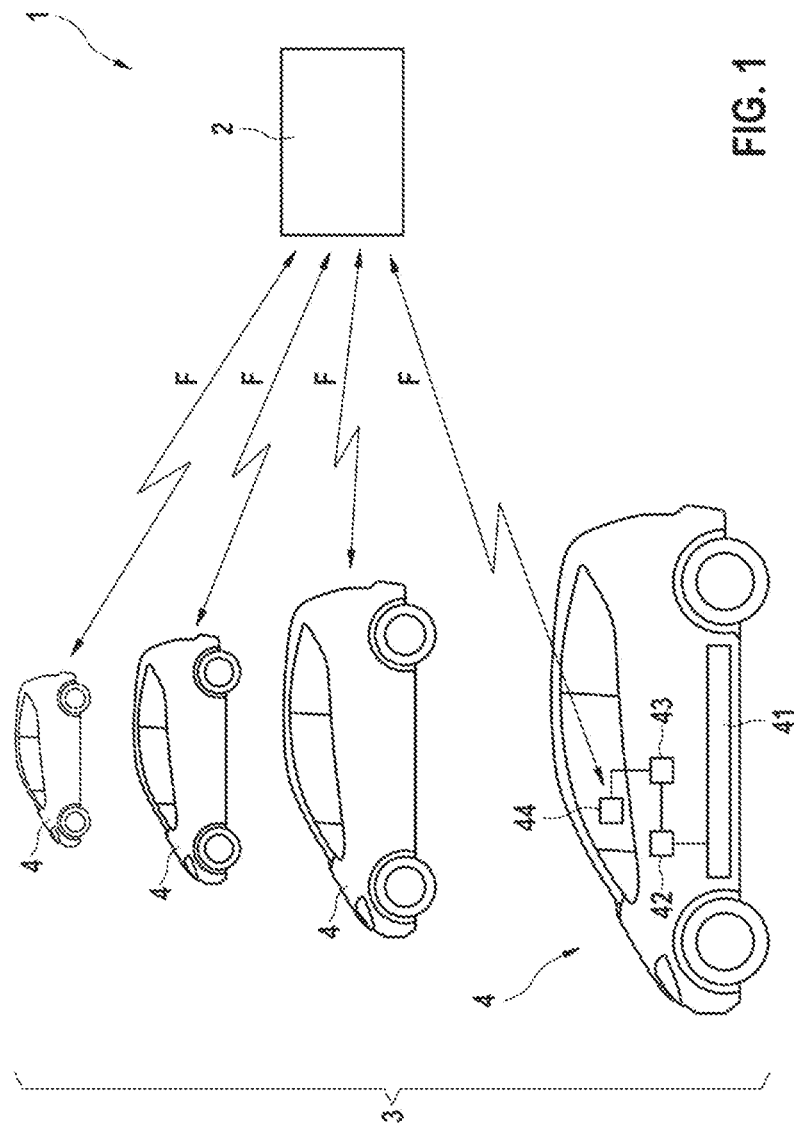
FIG. 1 shows a schematic illustration of a system for providing driver-specific and vehicle-specific operating variables for determining a state of health of a vehicle battery in a central processing unit.

FIG. 1 shows a system 1 for collecting fleet data in a central processing unit 2 for the purpose of creating and operating and evaluating a state of health model. The state of health model is used to determine a state of health of an electrical energy store, for example a vehicle battery or a fuel cell, in a motor vehicle. FIG. 1 shows a vehicle fleet 3 having a plurality of motor vehicles 4.

One of the motor vehicles 4 is illustrated in greater detail in FIG. 1. The motor vehicles 4 each have a vehicle battery 41 as a rechargeable electrical energy store, an electric drive motor 42 and a control unit 43. The control unit 43 is connected to a communication module 44 which is suitable for transmitting data between the respective motor vehicle 4 and a central processing unit 2 (a so-called cloud).

The motor vehicles 4 transmit, to the central processing unit 2, the operating variables F which indicate at least variables, on which the state of health of the vehicle battery depends. In the case of a vehicle battery, the operating variables F may indicate a present battery current, a present battery voltage, a present battery temperature and a present state of charge (SOC), at the pack, module and/or cell level. The operating variables F are captured in a fast time frame of 2 Hz to 100 Hz and can be regularly transmitted to the central processing unit 2 in uncompressed and/or compressed form. For example, the time series can be transmitted in blocks to the central processing unit 2 at an interval of 10 minutes to several hours.

Operating features M which relate to an evaluation period can be generated from the operating variables F in the central processing unit 2 or, in other embodiments, even already in the respective motor vehicles 4. The evaluation period for determining the state of health may be a few hours (for example 6 hours) to several weeks (for example a month). A conventional value for the evaluation period is one week.

The operating features may comprise, for example, features based on the evaluation period and/or accumulated features and/or statistical variables determined over the entire past service life. In particular, the operating features may comprise, for example: electrochemical states (layer thicknesses, concentrations, cyclizable lithium, etc.), histogram data against the state of charge characteristic, the temperature, the battery voltage, the battery current, in particular histogram data relating to the battery temperature distribution against the state of charge, the charging current distribution against the temperature and/or the discharge current distribution against the temperature, an accumulated total charge (Ah), an average capacity increase during a charging operation (in particular for charging operations in which the increase in charge is above a threshold proportion (for example 20%) of the total battery capacity), a maximum of the differential capacity (dQ/dU: change in charge divided by change in the battery voltage) and others.

Further details can be gathered from the operating features M: a temporal load pattern, such as charging and driving cycles, determined by usage patterns (for example fast charging at high current intensities or strong acceleration or regenerative braking operations), a usage time of the vehicle battery, a charge accumulated over the running time and a discharge accumulated over the running time, a maximum charging current, a maximum discharge current, a frequency of charging, an average charging current, an average discharge current, a power throughput when charging and discharging, an (in particular average) charging temperature, an (in particular average) spread of the state of charge and the like.

The state of health (SOH) is the key variable for indicating a remaining battery capacity or a remaining battery charge. The state of health describes an extent of the ageing of the vehicle battery or a battery module or a battery cell and can be stated as a capacity retention rate (SOH-C) or as a rise in the internal resistance (SOH-R). The capacity retention rate SOH-C is stated as a ratio of the measured present capacity to a starting capacity of the fully charged battery. The relative change in the internal resistance SOH-R increases with increasing ageing of the battery.

A state of health model which is, in particular, entirely or partially data-based is implemented in the central processing unit 2. The state of health model can be used regularly, that is to say after the expiry of the respective evaluation period, to determine the present state of health of the vehicle battery 41 on the basis of the operating features. In other words, it is possible to determine a state of health of the relevant vehicle battery 41 or of this energy store associated modules or cells on the basis of the operating features which result from the operating variable characteristics of one of the motor vehicles 4 in the fleet 3.

Furthermore, future states of health of the vehicle battery 41 can be determined operating features, for example by means of linear or non-linear extrapolation or with the aid of a prediction model. Data-based algorithms can preferably be used to predict the operating features, for example autoregressive methods with the aid of ARIMA models which, in addition to trends, also characterize periodicities in the characteristic of the historical operating features for the prediction thereof.

Figure 2:
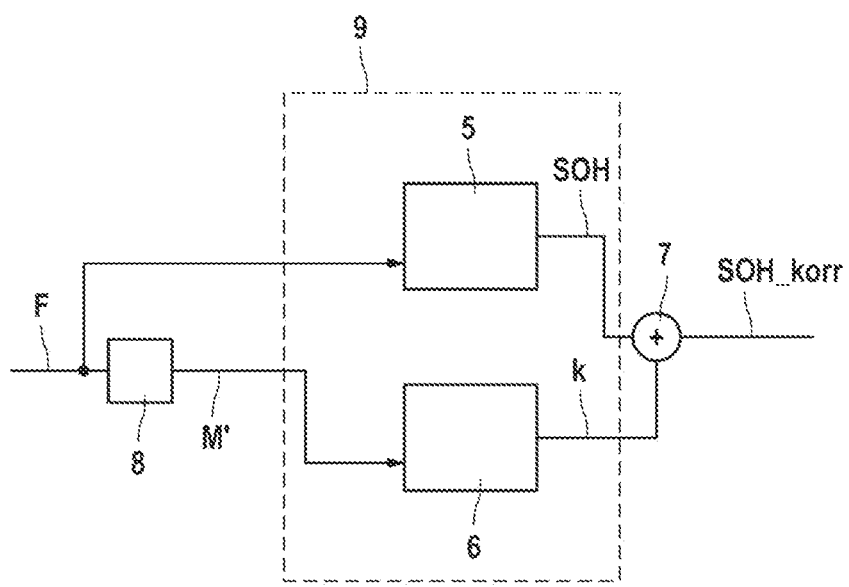
FIG. 2 shows a schematic illustration of a functional structure of a hybrid state of health model.

FIG. 2 schematically shows, by way of example, the functional structure of an embodiment of a data-based state of health model 9 which is constructed in a hybrid manner. The state of health model 9 comprises a physical ageing model 5 and a correction model 6. They receive operating variables F or operating features M of a present evaluation period. The operating features M of the present evaluation period are generated in a feature extraction block 8 on the basis of the time series of the operating variables F.

The operating variables F go directly into the physical state of health model 5 which is preferably in the form of an electrochemical model and describes corresponding electrochemical states, such as layer thicknesses (for example SEI thickness), change in the cyclizable lithium on account of anode/cathode secondary reactions, fast consumption of electrolytes, slow consumption of electrolytes, loss of the active material in the anode, loss of the active material in the cathode, etc.), with the aid of non-linear differential equations.

The physical ageing model 5 corresponds to an electrochemical model of the battery cell and of the cell chemistry. This model determines internal physical battery states on the basis of the operating variables F in order to provide a physically based state of health in the form of a capacity retention rate (SOH-C) and/or an internal resistance rate of rise (SOH-R).

However, the model values provided by the electrochemical model for the state of health SOH are inaccurate in certain situations and provision is therefore made for them to be corrected using a correction variable k. The correction variable k is provided by the data-based correction model 6 which is trained with the aid of training data sets from the vehicles 4 in the vehicle fleet 3.

In order to determine a corrected state of health SOH_korr, the outputs SOH, k of the physical ageing model 5 and of the correction model 6, which is preferably in the form of a Gaussian process model, are applied to one another. In particular, they can be added or multiplied (not shown) in a summation block 7 in order to obtain the corrected state of health SOH_korr for a present evaluation period.

Other configurations of the data-based state of health model are likewise possible; for example, the data-based state of health model may be in the form of a non-hybrid, purely data-based model based on a probabilistic regression model or a regression model based on artificial intelligence, in particular a Gaussian process model, or a Bayesian neural network. This is trained to provide a state of health SOH from an operating feature point which is determined by present operating features M of a present evaluation period, wherein the operating features are determined in a feature extraction block 8 on the basis of the time series of the operating variables F.

Figure 3:
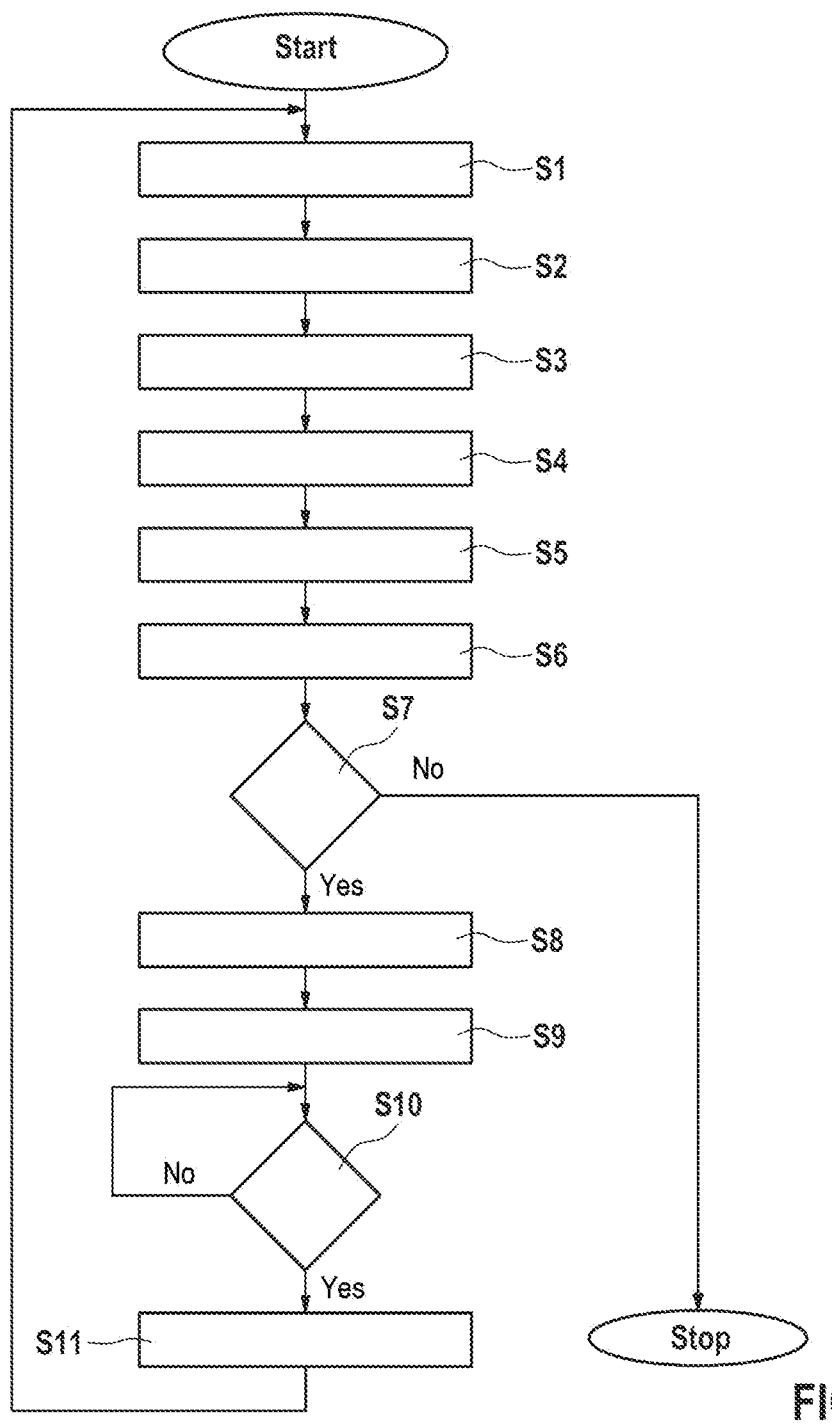
FIG. 3 shows a flowchart for illustrating a method for providing a state of health model in the central processing unit.

FIG. 3 illustrates a flowchart which describes in more detail the sequence of a method for operating a fleet-based system from FIG. 1. Since the generation of labels for training a state of health model is generally complicated and requires a time in which the motor vehicle is not used in order to determine the present state of health of a vehicle battery, in particular the capacity retention rate, the method illustrated is aimed at effecting the data-based state of health model with the smallest possible number of measurements of the actual state of health in the motor vehicles in the vehicle fleet. The method is based on a fleet-based system, as illustrated in FIG. 1. A data-based state of health model is implemented in the central processing unit 2.

In step S1, operating variables F relating to a present time are received from the vehicles 4 in the vehicle fleet 3.

In step S2, operating features are each extracted from the operating variables F, which operating features make it possible to determine a present state of health SOH of the respective vehicle battery 41 with the aid of the data-based state of health model 9. For this purpose, the state of health model 9 is evaluated at an appropriate operating feature point and is assigned the model value corresponding to a modeled state of health. Furthermore, the state uncertainty is evaluated as a model output. The operating feature points of all vehicles are accordingly stored in a database.

In step S3, the operating feature points are evaluated using the data-based state of health model 9 in order to obtain a state uncertainty for each of the operating feature points. As a result, corresponding state uncertainties are obtained for all operating feature points.

Figure 4:
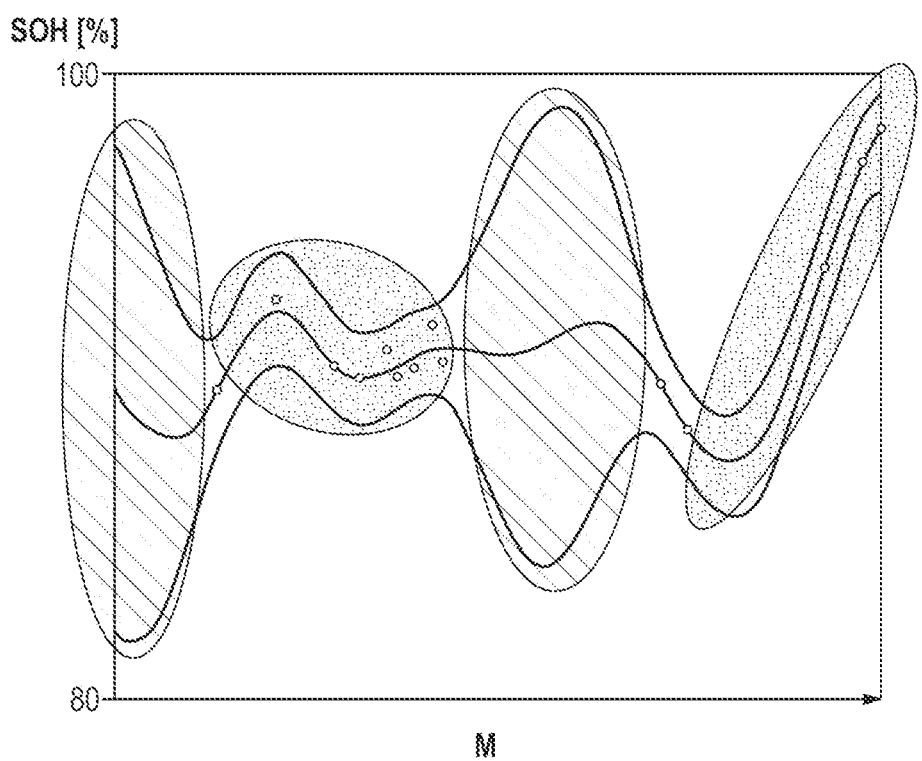
FIG. 4 shows, by way of example, a characteristic of the modeled state of health and of the confidence interval against an exemplary operating feature.

FIG. 4 shows, by way of example, the characteristic of the modeled state of health SOH and the confidence interval, which corresponds to the state uncertainty, against an exemplary operating feature M, wherein only one operating feature M is considered for the sake of clarity. The uncertainty regions as regions of high state uncertainty are illustrated using hatching and the regions of low state uncertainty are illustrated using dots.

In step S4, a number of those operating feature points which have the highest state uncertainties after sorting according to the state uncertainty are selected from the state uncertainties determined in this manner. In addition to the present selected states of health, all historical states of health of all known energy stores since start-up are additionally used. The number may be between 50 and 500, for example 100. In particular, a number of operating feature points for which a state uncertainty is high, in particular exceeds a predefined model uncertainty threshold value, or for which a confidence is low, in particular falls below a predefined confidence threshold value, are selected. The state uncertainties now relate to present states of health in the fleet of energy stores.

In step S5, a clustering method is applied to the number of selected operating feature points. A number, in particular two cluster areas, is preferably predefined for the clustering method, with the result that a normal cluster area and an anomaly cluster area result during clustering.

A centroid of the normal cluster area is determined as the result of the clustering method. The representative normal cluster area is characterized in that, on the one hand, a large proportion of the selected operating feature points (for example more than a predefined limit value (for example 90%) of all operating feature points) is part of said cluster area.

Furthermore, features in the normal cluster usually have a normal stochastic distribution, that is to say the combination of a plurality of average operating feature points which are therefore representative of the normal behavior of the fleet is concentrated at the centroid over a plurality of features and therefore over a plurality of dimensions. The closer the uncertain states of health, at which a label can currently be generated, are to the centroid of the normal cluster, the more representative of the fleet this state is.

In step S6, a present operating feature point, that is to say an operating feature point which relates to the evaluation period which ended last, which is closest to the centroid, is then determined from the selected number of operating feature points. Alternatively, the mean value of the operating feature points assigned to the normal cluster area can also be determined and that operating feature point which is at the shortest Euclidean distance from the mean value can be determined.

The clustering method can be carried out using one of the following methods, preferably from the field of unsupervised learning: K-means, EM clustering, Gaussian mixture models, competitive learning and the like.

Step S7 checks whether the selected operating feature point satisfies a safety criterion. If this is the case (alternative: yes), the method is continued with step S8 and otherwise (alternative: no) the selected operating feature point is rejected and the method is terminated. This ensures that, on the one hand, the selected operating feature point is physically useful and, on the other hand, complies with a physical safety limit and limitations of the battery management system since not every operating feature point can be set. For example, the temperature of the vehicle battery 41 is an operating feature which physically cannot be approached owing to derating limits in the system.

An example of an impermissible operating feature point is, for example, a feature which can be measured by means of diagnosis only at high loads, for example at high temperatures or high currents, which currently can no longer be represented owing to the aged battery (high internal resistance owing to SOHR) because the battery management system would intervene beforehand.

Furthermore, in S7, an unuseful operating feature point may be present, for example, if a balancing operation has not taken place for a relatively long time at the relevant energy store and the expected accuracy of the label generation would therefore not be high enough.

Possible alternative strategies for selecting the relevant vehicle are active learning methods, such as pool-based sampling, uncertainty sampling, variance reduction, representative active learning or expected error reduction.

If the operating feature point has been determined, that motor vehicle 4 in the vehicle fleet 3 whose vehicle battery 41 is currently being operated such that its operating features correspond as accurately as possible to the selected operating feature point is then selected in step S8.

In step S9, the selected motor vehicles are either requested or informed to carry out a label generation method in a predetermined time window during the present evaluation period or the evaluation is carried out in an automated manner at a charging station. The predetermined time window may ideally be during the night when a charging operation with the greatest possible swing in the state of charge is carried out. This reduces the impairment to the user since the label generation methods, that is to say the determination of the present state of health, are generally time-consuming.

In order to generate a label, the vehicle battery 41 is ideally fully discharged and then fully charged in a charging operation in order to determine the total battery capacity used for charging. This indicates the state of health of the vehicle battery in comparison with the battery capacity for the installation state. Other label generation methods, that is to say for determining the present state of health, for example with the aid of a suitable diagnostic sensor, are likewise conceivable but often have a lower reliability which must be taken into account, if appropriate, when retraining the state of health model.

If the motor vehicle 4 from the vehicle fleet 3 is requested to carry out a measurement operation for generating a label, the user of the motor vehicle 4 or its owner may be simultaneously informed, by means of suitable communication means, for example his mobile device, by email or the like, that the motor vehicle 4 is not available or should not be used during label generation. Alternatively, highly-automated label generation can be carried out if the user agrees.

Step S10 checks whether the label generation has been completed. If this is the case (alternative: yes), the relevant motor vehicle 4 communicates this to the central processing unit 2 in step S11 and transmits the determined label, that is to say the actual measured state of health. A further training data set for retraining the data-based state of health model or making it more precise is then available in the central processing unit 2 in conjunction with the operating feature point of the relevant vehicle 4. Otherwise (alternative: no), the process jumps back to step S6.

Figure 5:
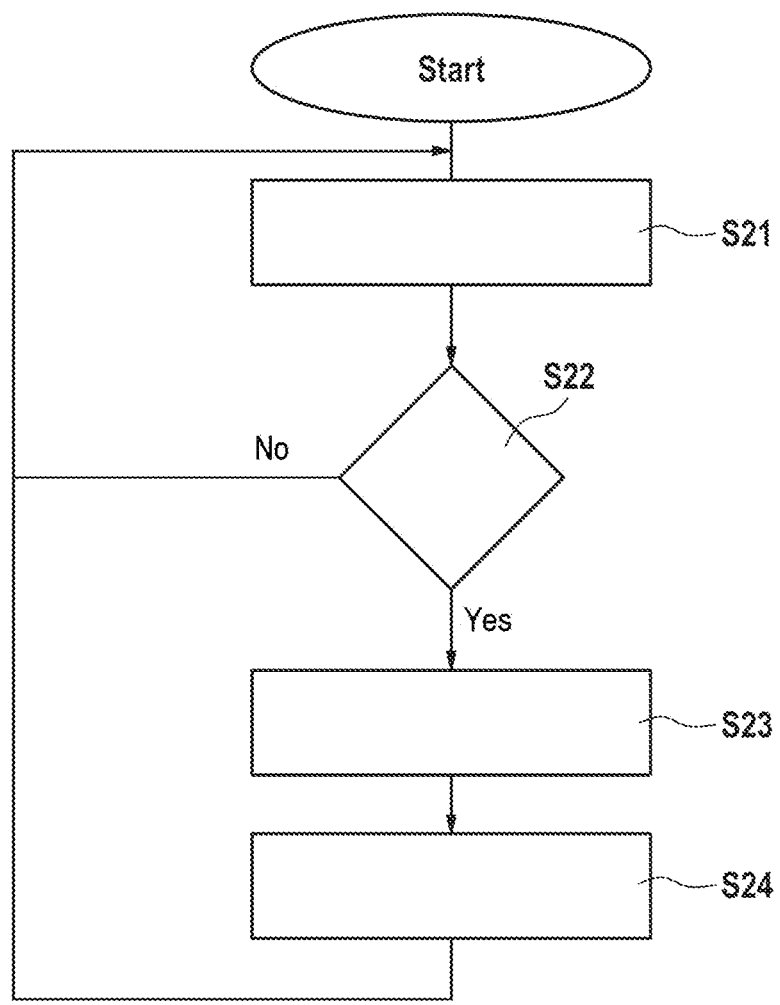
FIG. 5 shows a flowchart for illustrating a method for operating a motor vehicle for generating a label for the state of health model.

FIG. 5 shows a flowchart for illustrating a method which is carried out in one of the motor vehicles in the vehicle fleet.

In step S21, the vehicle in the vehicle fleet transmits the operating variables for a present evaluation period, that is to say, in particular, the characteristics of the battery current, the battery voltage, the battery temperature and the state of charge.

Step S22 checks whether a request for label generation has been received from the central processing unit. If this is the case (alternative: yes), the method is continued in step S23 and otherwise (alternative: no) the process jumps back to step S21.

In step S23, label generation is started at the time contained in the request from the central processing unit 2. For this purpose, the vehicle should be in a charging state. The label generation can therefore be carried out for the charging operation which corresponds in the best possible way to the predefined time.

One possible way of generating labels is to fully discharge the vehicle battery 41 under conditions which are defined as far as possible and to then fully charge it with a low current intensity, wherein the amount of energy which can be stored in the vehicle battery 41 is measured. In conjunction with an initial battery capacity, this indicates the present state of health. If the request for label generation is received in the motor vehicle, it is possible to wait for a next charging operation and the label generation can be started when a predefined time or day of the week is present. The time and/or the day of the week is/are selected such that the user of the motor vehicle is impaired to the least possible extent.

If the label generation is completed, the determined state of health is transmitted to the central processing unit 2 in step S24. The method is then continued with step S21.

What is claimed is:

1. A method for operating a central processing unit which is communicatively connected to a plurality of devices having electrical energy stores, comprising:
   determining a data-based state of health model which is trained to assign a state of health to a corresponding operating feature point of a plurality of operating feature points which characterizes operation of a corresponding electrical energy store of the electrical energy stores of the plurality of devices and results from a plurality of operating features;
   determining the plurality of operating feature points for the electrical energy stores of the plurality of devices;
   selecting at least one of the operating feature points based on state uncertainties of the states of health of all operating feature points of the corresponding electrical energy store, such that the at least one operating feature point has a highest relevance for improving the state uncertainties of the operating feature points determined;
   selecting at least one device from the plurality of devices based on the at least one selected operating feature point;
   measuring a present actual state of health in the at least one selected device; and
   retraining or updating the data-based state of health model based on a result of the measurement of the actual state of health.

2. The method according to claim 1, wherein at least one of the operating feature points is selected by:
   determining a predefined number of the operating feature points with highest state uncertainties of the state of health; and
   selecting, from the predefined number of the operating feature points, that operating feature point which is closest to a centroid of a cluster area found using a clustering method.

3. The method according to claim 2, wherein the clustering method is carried out using at least one of K-means, EM clustering, Gaussian mixture models, and competitive learning.

4. The method according to claim 1, further comprising:
   determining the plurality of operating features for an evaluation period from temporal characteristics of operating variables of the corresponding electrical energy store.

5. The method according to claim 1, wherein the data-based state of health model is a purely data-based or hybrid model with a probabilistic regression model including a Gaussian process model or a Bayesian neural network.

6. The method according to claim 1, wherein:
   the at least one selected operating feature point is checked for physical safety limits and limitations of an operation of the corresponding electrical energy store according to at least one predefined criterion, and
   a selection of at least one device from the plurality of devices based on the at least one selected operating feature point for measuring the present actual state of health depends on a result of the check for physical safety limits and limitations.

7. The method according to claim 1, wherein the selection of at least one device from the plurality of devices with states of the corresponding electrical energy store which correspond optimally to the operating feature point is carried out using an active learning method including pool-based sampling, uncertainty sampling, variance reduction, and/or expected error reduction.

8. The method according to claim 1, wherein:
   model parameters of a retrained state of health model are transmitted to the plurality of devices, and
   the state of health is determined in the plurality of devices.

9. The method according to claim 1, wherein the plurality of devices comprise a motor vehicle, a pedelec, an aircraft, a drone, a machine tool, a consumer electronics device including a mobile telephone, an autonomous robot, and/or a household appliance.

10. The method according to claim 1, wherein a computer program product includes instructions which, when the computer program product is executed by at least one data processing device, causes the at least one data processing device to carry out the method.

11. The method according to claim 10, the computer program product is stored on a non-transitory machine-readable storage medium.

12. An apparatus for operating a central processing unit which is communicatively connected to a plurality of devices having electrical energy stores, comprising:
   at least one data processing device configured to:
      determine a data-based state of health model which is trained to assign a state of health to a corresponding operating feature point of a plurality of operating feature points which characterizes operation of a corresponding electrical energy store of the electrical energy stores of the plurality of devices and results from a plurality of operating features;
      determine the plurality of operating feature points for the electrical energy stores of the plurality of devices;
      select at least one of the operating feature points based on state uncertainties of the states of health of all operating feature points of the corresponding electrical energy store, such that the at least one operating feature point has a highest relevance for improving the state uncertainties of the operating feature points determined;

select at least one device from the plurality of devices based on the at least one selected operating feature point;

measure a present actual state of health in the at least one selected device; and retrain or update the data-based state of health model based on a result of the measurement of the actual state of health.

* * * * *